(12) United States Patent
Castaldi et al.

(10) Patent No.: US 8,512,504 B2
(45) Date of Patent: Aug. 20, 2013

(54) PROCESS FOR IMPROVING ADHESION OF POLYMERIC MATERIALS TO METAL SURFACES

(76) Inventors: Steven A. Castaldi, Torrington, CT (US); Kesheng Feng, Cheshire, CT (US)

( * ) Notice: Subject to any disclaimer, the term of this patent is extended or adjusted under 35 U.S.C. 154(b) by 945 days.

(21) Appl. No.: 12/436,260

(22) Filed: May 6, 2009

(65) Prior Publication Data

US 2010/0282393 A1    Nov. 11, 2010

(51) Int. Cl.
  *B29C 65/00*    (2006.01)
(52) U.S. Cl.
  USPC .......................................... 156/281; 156/60
(58) Field of Classification Search
  USPC .............................................. 156/60
  See application file for complete search history.

(56) References Cited

U.S. PATENT DOCUMENTS

| | | | |
|---|---|---|---|
| 4,395,301 A | 7/1983 | Bauer et al. | |
| 4,409,037 A | 10/1983 | Landau | |
| 4,512,818 A | 4/1985 | Valayil et al. | |
| 4,629,679 A | 12/1986 | Uchida et al. | |
| 4,642,161 A | 2/1987 | Akahoshi et al. | |
| 4,775,444 A | 10/1988 | Cordani | |
| 4,844,981 A | 7/1989 | Landau | |
| 4,902,551 A | 2/1990 | Nakaso et al. | |
| 4,976,990 A | 12/1990 | Bach et al. | |
| 4,981,560 A | 1/1991 | Kajihara et al. | |
| 4,997,516 A * | 3/1991 | Adler ............................ | 216/101 |
| 4,997,722 A * | 3/1991 | Adler ............................ | 428/596 |
| 5,261,154 A * | 11/1993 | Ferrier et al. .................. | 29/830 |
| 5,289,630 A | 3/1994 | Ferrier et al. | |
| 5,300,323 A | 4/1994 | Ahmed | |
| 5,376,248 A | 12/1994 | Conrod et al. | |
| 5,532,094 A | 7/1996 | Arimura et al. | |
| 5,800,859 A | 9/1998 | Price et al. | |
| 5,840,363 A | 11/1998 | Rosch et al. | |
| 5,869,130 A | 2/1999 | Ferrier | |
| 6,020,029 A | 2/2000 | Ferrier et al. | |
| 6,294,220 B1 | 9/2001 | McGrath et al. | |
| 6,419,784 B1 | 7/2002 | Ferrier | |
| 7,327,017 B2 | 2/2008 | Sirinorakul et al. | |
| 2007/0228333 A1* | 10/2007 | Owei et al. .................... | 252/387 |

FOREIGN PATENT DOCUMENTS

WO    WO96/19097    6/1996

OTHER PUBLICATIONS

Allan G. Osborne, Ph.D., An Alternate Route to Red Oxide for Inner Layers, PC Fab, Aug. 1984.

* cited by examiner

*Primary Examiner* — Philip Tucker
*Assistant Examiner* — Alex Efta
(74) *Attorney, Agent, or Firm* — Carmody & Torrance LLP

(57) ABSTRACT

A process for treating metal surfaces that includes first contacting the metal surface with a particular acidic peroxide adhesion promoting composition, followed by contacting that metal surface with an aqueous acid post-dip composition to provide a micro-roughened surface. This treatment is particularly suitable for treating metal surfaces used in printed circuit multilayer construction.

14 Claims, 2 Drawing Sheets

PROCESS FOR IMPROVING ADHESION OF POLYMERIC MATERIALS TO METAL SURFACES

FIELD OF THE INVENTION

The present invention relates generally to a process of improving adhesion of polymeric materials to metal surfaces in printed circuit board multilayer board construction.

BACKGROUND OF THE INVENTION

Printed circuits containing one or more circuitry innerlayers are in prominent use today as demand increases for further and further weight and space conservation in electronic devices.

In the typical fabrication of a multilayer printed circuit, patterned circuitry innerlayers are first prepared by a process in which a copper foil-clad dielectric substrate material is patterned with resist in the positive image of the desired circuitry pattern, followed by etching away the exposed copper. Upon removal of the resist, the desired copper circuitry pattern remains.

One or more circuitry innerlayers of any particular type or types of circuitry pattern, as well as circuitry innerlayers which might constitute ground planes and power planes, are assembled into a multilayer circuitry by interposing one or more partially-cured dielectric substrate material layers (so called "pre-preg" layers) between the circuitry innerlayers to form a composite of alternating circuitry innerlayers and dielectric substrate material. The composite is then subjected to heat and pressure to cure the partially-cured substrate material and achieve bonding of circuitry innerlayers thereto. The cured composite will then have a number of through holes drilled therethrough, which are metallized to provide a means for conductively interconnecting all circuitry layers. In the course of the through hole metallizing process, desired circuitry patterns are typically formed on the outer facing layers of the multilayer composite.

An alternate approach to the formation of a multilayer printed circuit board is through additive or surface laminate circuitry techniques. These techniques begin with a non-conductive substrate, upon which the circuit elements are additively plated. Further layers are achieved by repeatedly applying an imageable coating upon the circuitry and plating further circuit elements upon the imageable coating.

The strength of the adhesive bond formed between the copper metal of the circuitry innerlayers and the cured pre-preg layers, or other non-conductive coatings, in contact therewith can be insufficient, with the result that the cured multilayer composite or the coating is susceptible to delamination in subsequent processing and/or use. In response to this problem, various techniques have been developed for forming on the copper surfaces of the circuitry innerlayers (before assembling them with pre-preg layers into a multilayer composite) a layer of copper oxide, such as by chemical oxidation of the copper surfaces.

The earliest efforts in this regard (so-called "black oxide" adhesion promoters) produced somewhat minimal improvement in the bonding of the circuitry innerlayers to the dielectric substrate layers in the final multilayer circuit, as compared to that obtained without copper oxide provision. Subsequent variations on the black oxide technique included methods wherein there is first produced a black oxide coating on the copper surface, followed by post-treatment of the black oxide deposit with 15% sulfuric acid to produce a "red oxide" to serve as the adhesion promoter, such as described by A. G. Osborne, "An Alternate Route To Red Oxide For Inner Layers", PC Fab. August, 1984, as well as variations involving direct formation of red oxide adhesion promoter, with varying degrees of success being obtained. One notable improvement in this art is described in the U.S. Pat. Nos. 4,409,037 and 4,844,981 to Landau, the teachings of which are incorporated herein by reference in their entirety, and involves oxides formed from relatively high chlorite/relatively low caustic copper oxidizing compositions, and producing substantially improved results in circuitry inner layer adhesion.

As noted above, the assembled and cured multilayer circuit composite is provided with through-holes which require metallization in order to serve as a means for conductive interconnection of the circuitry layers of the circuit. The metallizing of the through-holes involves steps of resin desmearing of the hole surfaces, catalytic activation, electroless copper depositing, electrolytic copper depositing, and the like. Many of these process steps involve the use of media, such as acids, which are capable of dissolving the copper oxide adhesion promoter coating on the circuitry innerlayer portions exposed at or near the through hole. This localized dissolution of the copper oxide, which is evidenced by formation around the through-hole of a pink ring or halo (owing to the pink color of the underlying copper metal thereby exposed), can in turn lead to localized delamination in the multilayer circuit.

The art is well aware of this "pink ring" phenomenon, and has expended extensive effort in seeking to arrive at a multilayer printed circuit fabrication process which is not susceptible to such localized delamination. One suggested approach has been to provide the adhesion promoting copper oxide as a thick coating so as to retard its dissolution in subsequent processing simply by virtue of sheer volume of copper oxide present. Unfortunately, this thicker oxide coating is inherently less effective as an adhesion promoter per se. Other suggestions relating to optimization of the pressing/curing conditions for assembling the multilayer composite have also met with only limited success.

Other approaches to this problem involve post-treatment of the copper oxide adhesion promoter coating prior to assembly of circuitry innerlayers and pre-preg layers into a multilayer composite. For example, U.S. Pat. No. 4,775,444 to Cordani discloses a process in which the copper surfaces of the circuitry innerlayers are first provided with a copper oxide coating and then contacted with an aqueous chromic acid solution before the circuitry innerlayers are incorporated into the multilayer assembly. The treatment serves to stabilize and/or protect the copper oxide coating from dissolution in the acidic media encountered in subsequent processing steps (e.g., through-hole metallization), thereby minimizing pink ring/delamination possibilities.

U.S. Pat. No. 4,642,161 to Akahoshi et al., U.S. Pat. No. 4,902,551 to Nakaso et al., and U.S. Pat. No. 4,981,560 to Kajihara et al., and a number of references cited therein, relate to processes in which the copper surfaces of the circuitry innerlayers, prior to incorporation of the circuitry innerlayers into a multilayer circuit assembly, are first treated to provide a surface coating of adhesion-promoting copper oxide. The copper oxide so formed is then reduced to metallic copper using particular reducing agents and conditions. As a consequence, the multilayer assembly employing such circuitry innerlayers will not evidence pink ring formation since there is no copper oxide present for localized dissolution, and localized exposure of underlying copper, in subsequent through-hole processing. As with other techniques, however, processes of this type are suspect in terms of the adhesion attainable between the dielectric substrate layers and the metallic copper circuitry innerlayers. This is particularly so in these reduction processes since the circuitry bonding surface not only is metallic copper, but also presents the metallic copper in distinct phases (i.e. (1) copper-from-reduction-of-copper oxide over (2) copper of the copper foil) which are prone to separation/delamination along the phase boundary.

U.S. Pat. Nos. 4,997,722 and 4,997,516 to Adler similarly involve formation of a copper oxide coating on the copper surfaces of circuitry innerlayers, followed by treatment with a specialized reducing solution to reduce the copper oxide to metallic copper. Certain portions of the copper oxide apparently may not be reduced all the way to metallic copper (being reduced instead to hydrous cuprous oxide or cuprous hydroxide), and those species are thereafter dissolved away in a non-oxidizing acid which does not attack or dissolve the portions already reduced to metallic copper. As such, the multilayer assembly employing such circuitry innerlayers will not evidence pink ring formation since there is no copper oxide present for localized dissolution, and localized exposure of underlying copper, in subsequent through-hole processing. Here again, however problems can arise in terms of the adhesion between the dielectric layers and metallic copper circuitry innerlayers, firstly because the bonding surface is metallic copper, and secondly because the metallic copper predominately is present in distinct phases (i.e., (1) copper-from-reduction-of-copper oxide over (2) copper of the copper foil), a situation prone to separation/delamination along the phase boundary.

U.S. Pat. No. 5,289,630 to Ferrier et al., the teachings or which are incorporated herein by reference in its entirety, reveals a process whereby an adhesion promotion layer of copper oxide is formed on the circuit elements followed by a controlled dissolution and removal of a substantial amount of the copper oxide in a manner which does not adversely affect the topography.

PCT Application No. WO96/19097 to McGrath, the teachings of which are incorporated by reference herein in their entirety, discusses a process for improving the adhesion of polymeric materials to a metal surface. The process discussed involves contacting the metal surface with an adhesion-promoting composition comprising hydrogen peroxide, an inorganic acid, a corrosion-inhibitor and a quaternary ammonium surfactant.

U.S. Pat. No. 5,869,130, to Ferrier, the subject matter of which is herein incorporated by reference in its entirety, describes a process for improving the adhesion of polymeric materials to a metal surface, especially copper or copper alloy surfaces in the production of multilayer printed circuits. The process described in this patent application provides for contacting the metal surface with an adhesion-promoting composition comprising (a) an oxidizer; (b) an acid; (c) a corrosion inhibitor; (d) a source of halide ions; and (e) optionally, a water soluble polymer. That process provided excellent adhesion between the metallic and polymeric surfaces (i.e. the circuitry and the intermediate insulating layer), while eliminating or minimizing pink ring and operating economically, as compared to above noted conventional processes.

It would be desirable to provide an improved means of producing a substantially uniformly roughened metal surface that could be subsequently bonded with a polymeric material with no or minimal processing steps between the creating of the microroughened surface and the adhesion of the polymeric material thereto. The process can also be used for both inner layer and outer layer printed circuit board production.

SUMMARY OF THE INVENTION

It is an object of the present invention to provide an improved method of providing a roughened metal surface.

It is another object of the present invention to improve the adhesion between a roughened metal surface and a polymeric material adhered thereto.

The present invention relates generally to a process for improving/enhancing the adhesion between a metal surface and a polymeric material by contacting the metal surface with an adhesion-promoting composition followed by an acid post dip composition prior to bonding the polymeric material to the metal surface. The invention therefore proposes a process for treating a metal surface, said process comprising:

1) contacting the metal surface with an adhesion-promoting composition; and thereafter 2) treating the metal surface with an acid post-dip composition.

The polymeric materials, such as pre-preg layers or soldermask resists, can then be bonded to the metal surface.

DETAILED DESCRIPTION OF THE PREFERRED EMBODIMENTS

Figure 1A:
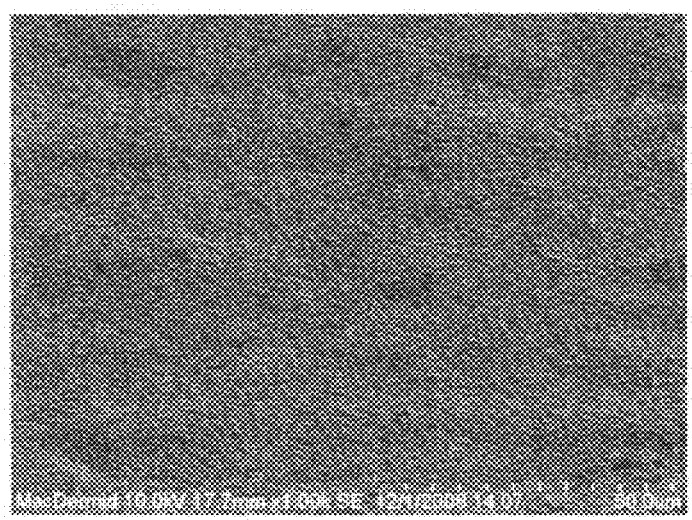
FIGS. 1A and 1B depict SEMs of the surface roughened metal surface at different magnifications.

The present invention is particularly suitable for treating copper surfaces with a combination of an acidic peroxide adhesion-promoting composition followed by an acid post-dip treatment.

The present invention relates generally to a method of adhering a polymeric resin, such as pre-preg layers or soldermask resists, to a metal surface, said process comprising:

(a) contacting the metal surface with an adhesion promoting composition;

(b) thereafter contacting the metal surface with an aqueous acid post-dip composition to provide a microroughened metal surface; and (c) thereafter adhering a polymeric resin to said microroughened metal surface.

In one embodiment, the polymeric resin is adhered to the microroughened metal surface without any additional processing steps between the steps of contacting with acid post-dip composition and adhering the polymeric resin to the metal surface.

In another embodiment, the metal surface is rinsed and dried prior to adhering the polymeric resin thereto.

The acid post-dip composition produces a substantially uniformly micro-roughened conversion-coated surface upon the metal. The surface produced is particularly suited to bonding with polymeric material because significantly increased adhesion values are achieved as compared to a non-treated metal surface. In addition, the roughened metal surface maintains the increased adhesion over time and also decreases the likelihood of any unwanted reactions occurring over time between the metal and the polymeric material. Further, in the manufacture of multilayer printed circuit boards, the use of this acid post-treatment provided resistance to the formation of pink ring.

The present process is particularly suited to the manufacture of multilayer printed circuit boards. Thus, in this application, the metal circuitry (usually copper) of the innerlayers is treated with the adhesion-promoting composition described herein. After further treatment in the acid post-dip solution described herein, and further water rinsing, the innerlayers are bonded together with polymeric materials such as pre-pregs, soldermask resists, or imageable dielectrics, resulting in the multilayer printed circuit board.

The metal surface to be treated may comprise a variety of metals such as copper, nickel, iron and alloys of the foregoing. However, the process of the invention produces the best results when the metal surfaces comprise copper or copper alloys. The polymeric material may be a variety of polymeric materials including pre-preg materials, imageable dielectrics, photoimageable resins, soldermasks, adhesives or polymeric etch resists.

The adhesion promoting composition may comprise:
(a) an oxidizer;
(b) an acid;
(c) a corrosion inhibitor;
(d) optionally, a source of halide ions; and
(e) optionally, a water soluble polymer.

Other similar adhesion promoting compositions are also usable in the practice of the invention.

The oxidizer usable in the adhesion-promoting composition may comprise any oxidizer which is capable of oxidizing the metal surface in the matrix of the adhesion-promoting composition. The inventors have found hydrogen peroxide and persulfates to be particularly preferred oxidizers for use in the process of the invention, with hydrogen peroxide being the most preferred oxidizer. The concentration of the oxidizer in the adhesion-promoting composition may range from 6 to 60 grams per liter but is preferably from 12 to 30 grams per liter.

The acid utilized in the adhesion-promoting composition may be any acid which is stable in the matrix. The inventors have found mineral acids to be particularly preferred, and sulfuric acid is especially preferred. The concentration of the acid in the adhesion-promoting composition may range from 5 to 360 grams per liter but is preferably from 70 to 110 grams per liter.

The corrosion inhibitor used in the adhesion-promoting composition is a compound which effectively reacts with the metal surface to form a protective complex layer. Preferred corrosion inhibitors are selected from the group consisting of triazoles, benzotriazoles, tetrazoles, imidazoles, benzimidazoles and mixtures of the foregoing. The concentration of the corrosion inhibitor in the adhesion-promoting composition may range from 1 to 20 grams per liter but is preferably in the range of from 6 to 12 grams per liter.

A source of halide ions may also optionally but preferably be included in the composition. If used, the source of halide ions may be any compound which would provide halide ions in the matrix of the adhesion-promoting composition. Preferably, the source of halide ions are alkali metal salts such as sodium chloride or potassium chloride, oxohalides such as sodium chlorate or potassium chlorate, or halide bearing mineral acids such as hydrochloric acid. Most preferably the source of halide ions provides chloride ions to the adhesion-promoting composition. The concentration of the source of halide ions in the adhesion-promoting composition may range from 5 to 500 milligrams per liter but is preferably from 10 to 50 milligrams per liter, all based on halide ion content.

Optionally, but preferably, the adhesion-promoting composition may also include a water soluble polymer. Preferably the water soluble polymer is not a surfactant but is instead a water soluble homopolymer or copolymer of low molecular weight. Most preferably, the water soluble polymer is a polymer of ethylene oxide, an ethylene oxide-propylene oxide copolymer, polyethylene glycols, polypropylene glycols or polyvinyl alcohols. Among the most preferred are the polymers of ethylene oxide, or polyethylene glycols sold by the Union Carbide company under the tradename Carbowax. The inventors have found Carbowax 750 and Carbowax MPEG 2000 to be particularly useful. Also particularly useful are the ethylene oxide polymers or ethylene oxide-propylene oxide copolymers sold by BASF under the tradename Pluronic®. The concentration of the water soluble polymer in the adhesion-promoting composition can range from 1 to 15 grams per liter, but is preferably from 3 to 6 grams per liter. The inventor has found that the incorporation of a combination of halide and water soluble polymer provides an optimal result in creating improved bonding and reliability between metal surfaces and polymeric bonding materials.

The metal surface can be treated with the adhesion-promoting composition in various ways, including immersion, spray, or flood, by way of example and not limitation. The temperature of the adhesion-promoting composition during treatment may range from 25° C. to 65° C. but is preferably from 30° C. to 50° C. The treatment time will vary depending upon the temperature and method of treatment but may range from 15 seconds to 15 minutes and is preferably from 1 to 2 minutes.

After treatment with the adhesion—promoting composition, the metal surface is treated with the acid post-dip composition described herein. The preferred acid post-dip composition comprises an aqueous solution of an acid, which in a preferred embodiment is a mineral acid. Hydrochloric acid is especially preferred. The concentration of acid in the post-dip composition is preferably in the range of about 2 to about 12% by weight, more preferably about 4% to about 10% by weight. The acid composition is maintained at a temperature of about 15 to about 20° C. The acid composition can be contacted with the metal surfaces in various ways including immersion, spray, or flood, by way of example and not limitation. Contact time may range from 20 seconds to 10 minutes, depending on the contact method used. In one embodiment, the acid composition is contacted with the metal surfaces by spraying for a time period of about 20 to about 30 seconds.

After this acid post-dip treatment and water rinsing, the treated metal surface can be bonded to polymeric material by any conventional process.

Example

A copper panel was first contacted with an adhesion promoting composition (Multibond® 100, available from MacDermid, Inc., Waterbury, Conn.) at a temperature of 27° C. by immersion for a period of about 1 minute.

Thereafter, the copper panel was rinsed by spraying and then contacted with an acid post-dip composition comprising 5% by weight hydrochloric acid. The acid post-dip composition was applied by spraying using 4 spraying bars and was contacted with the metal surface for 20 to 30 seconds. The acid post dip composition was maintained at a temperature of 15 to 20° C.

Figure 1B:
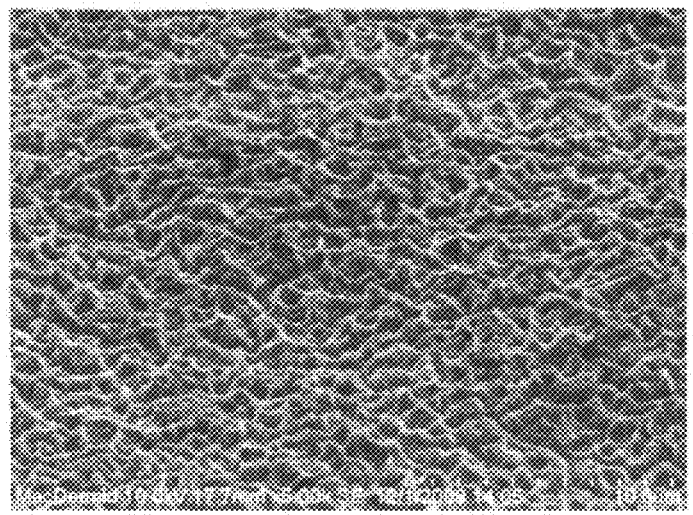

Thereafter, the copper panel was again rinsed by spraying and then dried. The total etch rate of the copper panel was measure to be 1 micron. FIGS. 1A and 1B depict SEMs of the copper panel after it has been microroughened in the acid-post dip composition at 2 different magnifications. As can be seen, the copper surface that has been roughened in the acid-post dip composition exhibits substantially uniform microroughness which enhances the adhesion of the polymeric material thereto.

What is claimed is:
1. A method of adhering a polymeric resin to a metal surface, said process comprising:
(a) contacting the metal surface with an adhesion promoting composition;

(b) thereafter contacting the metal surface with an aqueous acid post-dip composition to provide a microroughened metal surface; and (c) thereafter adhering a polymeric resin to said microroughened metal surface wherein the polymeric resin is adhered to the microroughened metal surface without any additional processing steps between the steps of contacting with acid post-dip composition and adhering the polymeric resin to the metal surface.

2. A method of adhering a polymeric resin to a metal surface, said process comprising:

(a) contacting the metal surface with an adhesion promoting composition;

(b) thereafter contacting the metal surface with an aqueous acid post-dip composition to provide a microroughened metal surface; and (c) thereafter adhering a polymeric resin to said microroughened metal surface wherein the adhesion promoting composition comprises:

(a) an oxidizer;

(b) an acid;

(c) a corrosion inhibitor;

(d) optionally, a source of halide ions; and (e) optionally, a water soluble polymer.

3. The method according to claim 2 wherein the oxidizer is selected from the group consisting of hydrogen peroxide and persulfates.

4. The method according to claim 2 wherein the acid is a mineral acid.

5. The method according to claim 2 wherein the corrosion inhibitor is selected from the group consisting of triazoles, benzotriazoles, imidazoles, benzimidazoles, tetrazoles and mixtures of the foregoing.

6. The method according to claim 2 wherein the water soluble polymer is selected from the group consisting of polymers of ethylene oxide, ethylene oxide-propylene oxide copolymers, polyethylene glycols, polypropylene glycols, polyvinyl alcohols, and mixtures of the foregoing.

7. The method according to claim 2 wherein the source of the metal surface comprises copper.

8. The method according to claim 2 wherein the source of halide ions is selected from the group consisting of alkali metal halide salts and oxohalide salts.

9. The method according to claim 8 wherein the source of halide ions is source of chloride ions.

10. The method according to claim 2, wherein the acid post-dip composition comprises hydrochloric acid.

11. The method according to claim 10, where the concentration of the hydrochloric acid in the acid post-dip composition is between about 2% and about 12% by weight.

12. The method according to claim 11, wherein the concentration of the hydrochloric acid in the acid post-dip composition is between about 4% and about 10% by weight.

13. The method according to claim 2, wherein the acid post-dip composition is maintained at a temperature of between about 15 and about 20° C.

14. The method according to claim 2, wherein the acid post-dip composition is applied by spray coating, immersion coating, curtain coating and combinations of one or more of the foregoing.

* * * * *